United States Patent [19]
Scott

[11] Patent Number: 5,227,269
[45] Date of Patent: Jul. 13, 1993

[54] METHOD FOR FABRICATING HIGH DENSITY DRAM RETICLES

[75] Inventor: David B. Scott, Plano, Tex.

[73] Assignee: Texas Instruments Incorporated, Dallas, Tex.

[21] Appl. No.: 542,293

[22] Filed: Jun. 22, 1990

[51] Int. Cl.⁵ .................................................. G03F 9/00
[52] U.S. Cl. ........................... 430/5; 156/659.1; 156/663; 430/296; 430/321; 430/323
[58] Field of Search ............. 156/659.1, 663, 654; 430/5, 296, 321, 323

[56] References Cited

U.S. PATENT DOCUMENTS

| | | | |
|---|---|---|---|
| 4,448,637 | 5/1984 | Hiraishi et al. | 156/635 |
| 4,761,303 | 8/1988 | Ruszczyk et al. | 427/96 |
| 4,969,200 | 11/1990 | Manns et al. | 382/8 |
| 4,979,223 | 12/1990 | Manns et al. | 382/8 |

OTHER PUBLICATIONS

S. M. Sze, *VLSI Technology*, 2nd Edition, Copyright 1988 pp. 157–160 and 165–167.

*Primary Examiner*—Joseph Golian
*Assistant Examiner*—Leslie Wong
*Attorney, Agent, or Firm*—Stanton C. Braden; Richard L. Donaldson; William E. Hiller

[57] ABSTRACT

A method of reticle fabrication is disclosed which will reduce e-beam write time by two orders of magnitude for a 64 megabit DRAM. The method involves the mix of using both e-beam and optical lithography on a single reticle.

9 Claims, 3 Drawing Sheets

METHOD FOR FABRICATING HIGH DENSITY DRAM RETICLES

BACKGROUND OF THE INVENTION

Typically, dynamic random access memories (DRAMS) are comprised of two components, array and periphery. The array is repetitively densely patterned on a semiconductor chip and each array includes a memory cell and associated decoders. The periphery, which contains most of the remaining circuitry required for operation is placed only once on the chip.

FIG. 1 illustrates a simplified top view of a conventional DRAM layout. As shown, array 2 is patterned many times on semiconductor chip 6 around periphery circuitry 4 which is patterned only once and in a centered position on chip 6. In the past, in order to achieve the layout illustrated in FIG. 1, masks were used which were made by stepping a single chip pattern onto a mask many times via optical lithography. The masks were then used in a one-to-one projection printer in realizing the desired design in on a semiconductor chip. Thus, each exposure of a mask onto a semiconductor slice generated the patterns for many chips from the slice simultaneously. With today's direct-step-on-wafer machines, one chip or a group of chips is exposed at a time. A pattern can be stepped on either a reticle or upon a wafer using a reticle via a method of e-beam lithography.

The proper fabrication of semiconductor mask reticles in the era of 16 megabit dynamic random access memories (DRAMS) and beyond presents many problems Today, reticles are fabricated using e-beam lithography techniques. These techniques require every geometry to be individually written directly into the reticle. At the 16 megabit level of integration, each reticle takes between 1 hour and 2 hours of time to write. In addition, due to the high accuracy requirements imposed by such high levels of semiconductor integration and due to the mean time between machine failure, a number of passes are required. Sometimes as many as 5 passes are required to get one non-defective reticle. This is true of the most advanced e-beam machine More conventional e-beam machines require on average, even a greater number of passes.

Documented cases have shown that at the 16 megabit level, over 3 months of mask making time is required to get a complete reticle set. This is a long time considering the fact that the reticle formation was a high priority task unto which many resources were available.

As DRAM densities continue to increase, the problems of reticle formation continue to get worse. When the magnitude of data increases and the size of the geometries get smaller, the resulting complexity increases by about one order of magnitude per generation of DRAM. Consequently, using conventional techniques, although reticle formation is difficult at the 16 megabit level, it will be almost impossible at the 64 megabit level, and certainly out of the question at the 256 megabit level.

OBJECTS OF THE INVENTION

It is an object of the invention to provide a method of reticle fabrication which will reduce e-beam write time.

It is another object of the invention to provide a method of reticle fabrication which will reduce e-beam write time.

It is another object of the invention to provide a new and improved method for fabricating high density reticles These and other object of the invention, together with the features and advantages thereof, will become apparent from the following detailed specification when read together with the accompanying drawings in which applicable reference numerals and labels have been carried forward.

SUMMARY OF THE INVENTION

The foregoing objects of the invention are accomplished by a method of fabricating DRAM reticles which includes patterning and etching a periphery pattern of a first predetermined scale multiple onto a first reticle glass and patterning and etching an array pattern of a second predetermined scale multiple onto a second reticle glass. An optical photoresist is placed over the first reticle and the array pattern is reduced down or magnified up to the scale of the second predetermined scale multiple The array pattern of the second reticle glass is then stepped an repeated onto the first reticle glass.

The method reduces e-beam write time by two orders of magnitude in the case of a 64 megabit DRAM. The method involves the mix of using both e-beam and optical lithography on a single reticle.

DETAILED DESCRIPTION OF THE INVENTION

Figure 2:
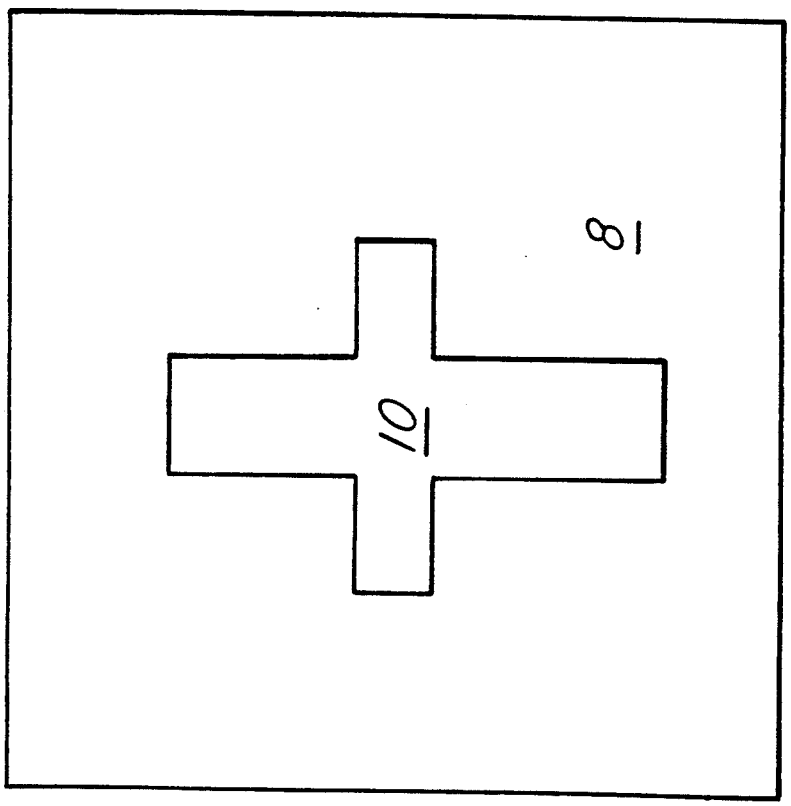
FIG. 2 illustrates a top view of one possible design for the periphery layout.

The method according to the preferred embodiment of the invention is accomplished by the following steps:

1. A 5× (5 times size increase) reticle is built for the construction of periphery, which is patterned and etched out onto a reticle glass using well known e-beam techniques. For instance, chrome is placed on glass; a photo resist is placed over the chrome; the resist is exposed with an electron beam as dictated by the input data; and the exposed portions of resist and its underlying chrome areas are etched away. FIG. 2 illustrates a top view of one possible design for the periphery layout with periphery pattern 10 on glass 8. As shown, this reticle is labeled "A."

Figure 1:
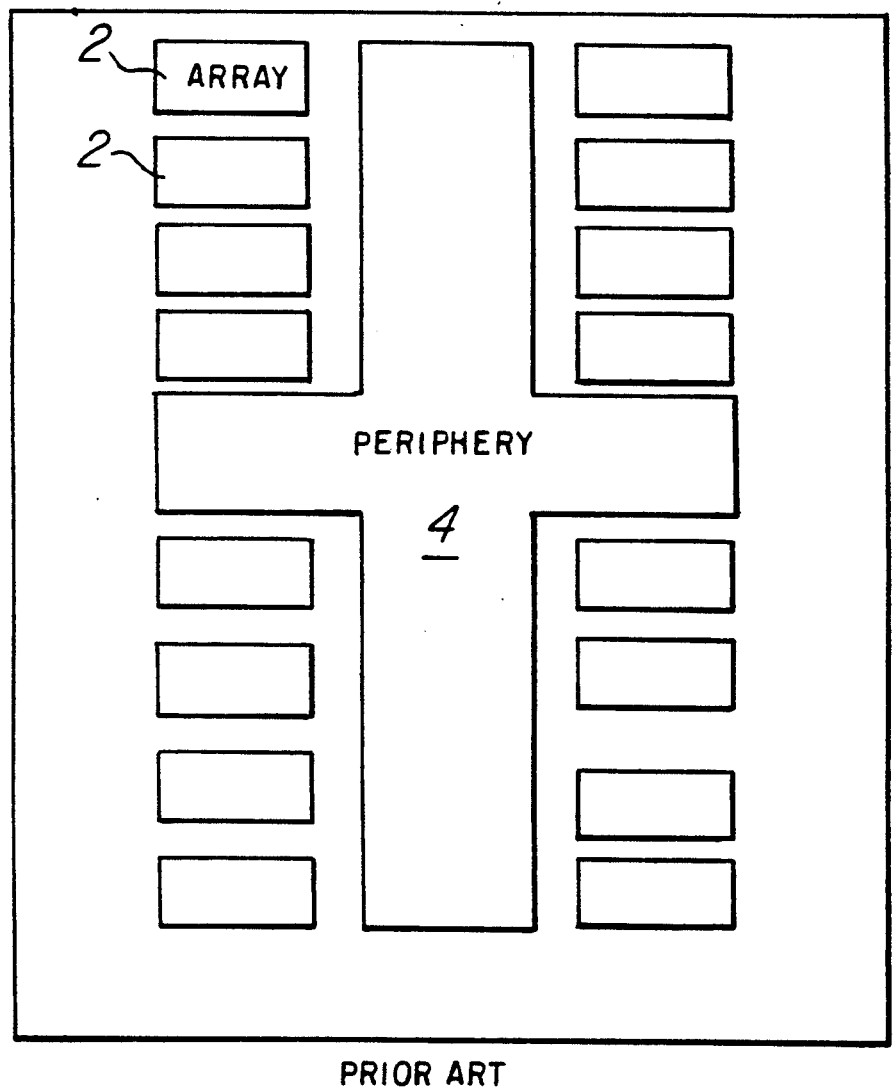
FIG. 1 illustrates a simplified top view of a conventional DRAM layout.
Figure 3:
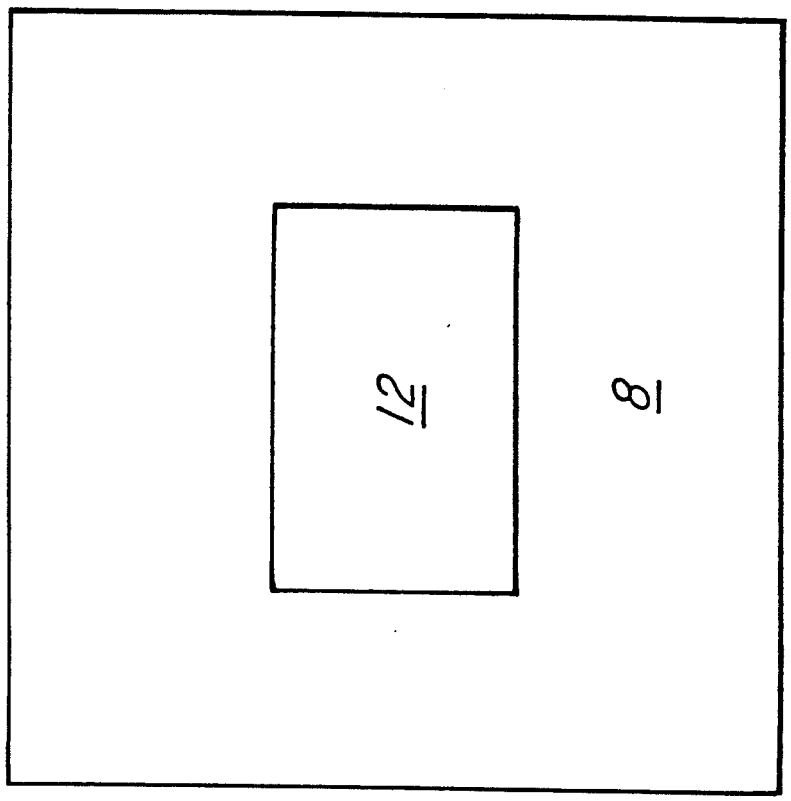
FIG. 3 illustrates a top view of one possible design for the array layout.

2. A 25× (25 times size increase) reticle is built using well known e-beam lithography techniques, which is patterned and etched out onto a second reticle glass, for the construction of an array. FIG. 3 illustrates a top view of one possible design for the array layout with array pattern 12 on glass 8. This reticle is labeled "B."

3. Next, an optical photoresist (not shown) is place over reticle A of FIG. 2.

4. As shown in the three dimensional drawing of FIG. 4, 5× stepper 20 steps and repeats array pattern 12 of reticle B onto reticle A as specified by the design database (not shown) used with stepper 20.

Figure 4:
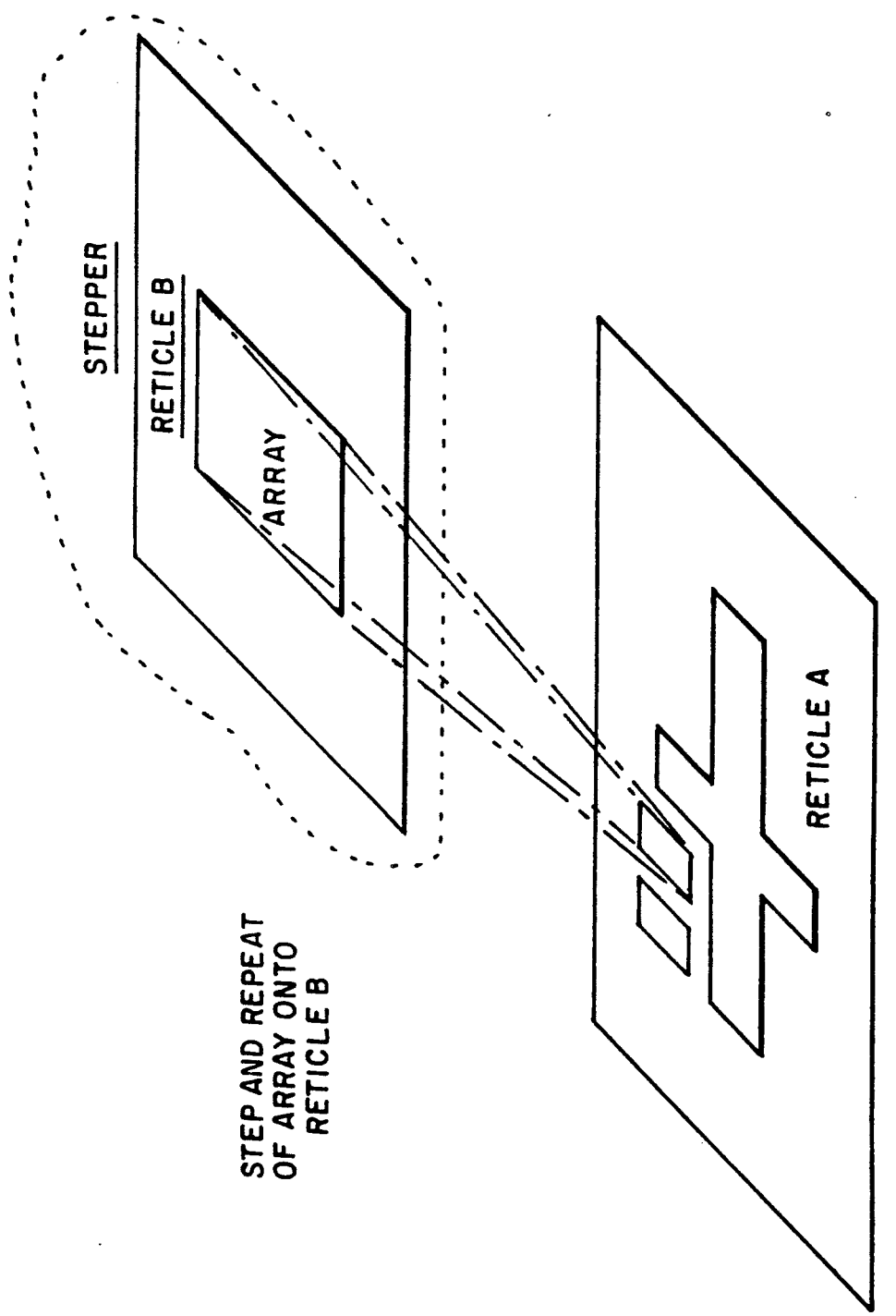
FIG. 4 is a three dimensional drawing showing a step and repeat configuration for the invention.

Note that in FIG. 4, 5× stepper 20 reduces 25× array pattern 12 down to 5 times its size and onto reticle glass A. Thus, pattern 10 and 12 now exist on the same scale on a common reticle, reticle A. Had patterns 10 and 12 been both done initially with an e-beam at for instance a 5 times scale (5×), it would take much too long a time to form the resulting reticle as discussed previously.

Since the lithography tool used for the reticle making is the same as that for wafer fabrication, the registration and linewidth problems are minimized due to the 5× difference between the patterns on reticles A and B of FIG. 4. Expressed another way, $$S^2 = S_1^2 + S_2^2$$

where $S_1$ = the registration error due to the wafer fabrication process, $S_2$ = the registration error due to the reticle fabrication process, $$S_2 = S_1/5$$

and $S$ = the total registration error

Thus $$S = \sqrt{(26/25)S_1^2} ,$$

and the resolution loss is minimum.

The increased throughput or rather the reduced electron beam write time is a very large advantage of the invention. At the 64 megabit level a 5 hour WRITE time is expected. Thus, at the 64 megabit level of semiconductor integration, e-beam write time is reduced at least two orders of magnitude over that using conventional methods. A typical stepper throughputs 50 slices/hour. Therefore, a 100 times gain is achievable because once reticle A and reticle B of FIG. 4 are built, the stepper time required to place a pattern on a semiconductor wafer is minimal In fact, the stepper time is 1/50 of an hour for an average wafer. This time is just over a minute.

At the 256 megabit DRAM level, the throughput improvement could be 1000 times. This is an enabling function since reticle making by the current state of the art is likely cost prohibitive.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For instance, although specific magnification numbers for the reticles have been have been given, larger or smaller magnification is possible. It is contemplated that all such changes and additional embodiments are within the spirit and true scope of the invention as claimed below.

I claim:

1. A method of fabricating DRAM reticles comprising: patterning and etching a periphery pattern onto a first reticle glass using an e-beam;

patterning and etching an array pattern onto a second reticle glass using an e-beam;

placing an optical photoresist over said first reticle; and stepping and repeating said array pattern of said second reticle glass onto said first reticle glass.

2. A method as recited in claim 1 wherein said periphery pattern is of a first predetermined scale multiple size and wherein said array pattern is of a second predetermined scale multiple size.

3. A method as recited in claim 2 which further includes reducing said array pattern to said first predetermined scale multiple size prior to said stepping and repeating step.

4. A method as recited in claim 3 wherein wafer fabrication from the resulting method of claim 3 uses the same stepper from which said reticles are made.

5. A method as recited in claim 3 wherein said pattern and etch step includes:

depositing a first material on a second material;

placing a photo resist over said first material; and exposing portions of said resist according to a predetermined scheme.

6. A method as recited in claim 5 wherein said pattern and etch step further includes removing said exposed resist and said first material underlying said exposed resist.

7. A method as recited in claim 5 wherein said pattern and etch step further includes removing unexposed resist and said first material underlying said unexposed resist.

8. A method as recited in claim 5 wherein said first material includes chrome and wherein said second material includes glass.

9. A method as recited in claim 2 wherein said first predetermined scale multiple size is 25 times scale and wherein said second predetermined scale multiple size is 5 times scale.

* * * * *